United States Patent
Kiso et al.

(10) Patent No.: US 10,495,386 B2
(45) Date of Patent: Dec. 3, 2019

(54) LOOP HEAT PIPE AND ELECTRONIC DEVICE

(71) Applicant: SHINKO ELECTRIC INDUSTRIES CO., LTD., Nagano (JP)

(72) Inventors: Takahiko Kiso, Nagano (JP); Nobuyuki Kurashima, Nagano (JP)

(73) Assignee: SHINKO ELECTRIC INDUSTRIES CO., LTD., Nagano (JP)

(*) Notice: Subject to any disclaimer, the term of this patent is extended or adjusted under 35 U.S.C. 154(b) by 0 days.

(21) Appl. No.: 16/202,626

(22) Filed: Nov. 28, 2018

(65) Prior Publication Data

US 2019/0204017 A1    Jul. 4, 2019

(30) Foreign Application Priority Data

Dec. 28, 2017 (JP) .................... 2017-254686

(51) Int. Cl.
  *F28D 15/04* (2006.01)
  *H01L 23/427* (2006.01)

(52) U.S. Cl.
  CPC .......... *F28D 15/043* (2013.01); *H01L 23/427* (2013.01)

(58) Field of Classification Search
  CPC .................. F28D 15/043; H01L 23/427
  USPC ........................................ 257/714
  See application file for complete search history.

(56) References Cited

U.S. PATENT DOCUMENTS

| | | | |
|---|---|---|---|
| 6,070,654 A | 6/2000 | Ito | |
| 10,408,546 B2* | 9/2019 | Kurashima | ......... F28D 15/0233 |
| 2016/0259383 A1 | 9/2016 | Shioga et al. | |
| 2017/0234625 A1 | 8/2017 | Inagaki et al. | |

FOREIGN PATENT DOCUMENTS

| | | |
|---|---|---|
| EP | 0429188 | 5/1991 |
| EP | 2759794 | 7/2014 |
| JP | H11-287577 | 10/1999 |
| JP | 2015-132400 | 7/2015 |
| JP | 2016-095108 | 5/2016 |
| JP | 2016-142416 | 8/2016 |
| WO | 2015/087451 | 6/2015 |

OTHER PUBLICATIONS

Extended European Search Report dated May 28, 2019 issued with respect to the corresponding European Patent Application No. 18210598.1.

* cited by examiner

*Primary Examiner* — Tu-Tu V Ho
(74) *Attorney, Agent, or Firm* — IPUSA, PLLC

(57) ABSTRACT

A loop heat pipe includes a stacked structure formed by metal layers that are stacked, including an outermost metal layer arranged at one outermost surface of the loop heat pipe. The stacked structure forms an evaporator configured to vaporize a working fluid and generate vapor, a condenser configured to liquefy the vapor of the working fluid, a vapor pipe configured to connect the evaporator and the condenser, and a liquid pipe configured to connect the evaporator and the condenser, to form a loop-shaped passage. The outermost metal layer has an outer surface formed with grooves.

18 Claims, 11 Drawing Sheets

LOOP HEAT PIPE AND ELECTRONIC DEVICE

CROSS-REFERENCE TO RELATED APPLICATION

This application is based upon and claims priority to Japanese Patent Application No. 2017-254686, filed on Dec. 28, 2017, the entire contents of which are incorporated herein by reference.

FIELD

Certain aspects of the embodiments discussed herein are related to a loop heat pipe, an electronic device including the loop heat pipe, and a method of manufacturing the loop heat pipe.

BACKGROUND

Recently, in mobile devices such as smartphones, tablets, lap-top PCs (Personal Computers), or the like, an amount of heat that is generated per unit area is increasing due to improvements in performance and reduction of size of the mobile devices, including reduction in thicknesses of the mobile devices.

In the mobile devices described above, it is difficult to provide a built-in fan for air-cooling or a built-in pump for water-cooling, due to the limited size of the mobile devices. Hence, the mobile devices use for cooling a metal sheet having a high thermal conductivity.

However, as the amount of heat that is generated further increases, it becomes more difficult to sufficiently dissipate the heat using only the metal plate. Accordingly, a loop heat pipe has been developed. The loop heat pipe includes an evaporator for absorbing the heat of a heat generating component, a condenser for dissipating the heat, and pipes connecting the evaporator and the condenser in a loop. A working fluid is sealed within the pipes.

Examples of heat pipes are proposed in Japanese Laid-Open Patent Publication No. 11-287577, International Publication Pamphlet No. WO2015/087451, and Japanese Laid-Open Patent Publication No. 2016-95108, for example.

When accommodating the loop heat pipe in an electronic device, it may be required to adjust a height position of at least one of the evaporator and the condenser. In this case, the pipes connecting the evaporator and the condenser need to be bent.

However, the inside of each pipe is a small rectangular hollow space. For this reason, when the pipe is bent, compressive stress is generated at a pipe wall on an inner part relative to a bending direction, and the pipe wall on the inner part is pushed and moved toward the inside of the pipe. On the other hand, tensile stress is generated at a pipe wall on an outer part relative to the bending direction, and the pipe wall on the outer part is pulled and moved toward the inside of the pipe. As a result, the pipe may be blocked or closed, to prevent the loop heat pipe from functioning properly.

SUMMARY

Accordingly, it is an object in one aspect of the embodiments to provide a loop heat pipe, an electronic device including the loop heat pipe, and a method of manufacturing the loop heat pipe, which can avoid blocking or closing of pipes connecting an evaporator and a condenser even when the pipes are bent.

According to one aspect of the embodiments, a loop heat pipe includes a stacked structure formed by a plurality of metal layers that are stacked, including a first metal layer arranged at a first outermost surface of the loop heat pipe, wherein the stacked structure forms an evaporator configured to vaporize a working fluid and generate vapor; a condenser configured to liquefy the vapor of the working fluid; a vapor pipe configured to connect the evaporator and the condenser; and a liquid pipe configured to connect the evaporator and the condenser, to form a loop-shaped passage, wherein the first metal layer has an outer surface formed with a plurality of first grooves.

According to another aspect of the embodiments, an electronic device includes a substrate; a heat generating component provided on the substrate; and a loop heat pipe according to the one aspect described above and provided on the substrate, wherein the evaporator is arranged in a region on the heat generating component.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1A:
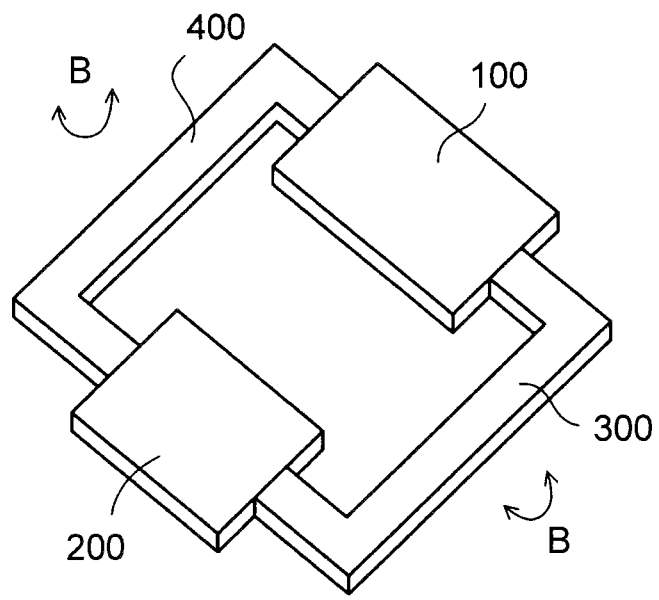
FIG. 1A is a perspective view illustrating a loop heat pipe studied by the present inventors.

Preferred embodiments of the present invention will be described with reference to the accompanying drawings. In the drawings, those parts that are the same are designated by the same reference numerals, and a repeated description of the same parts may be omitted.

A description will now be given of a loop heat pipe, an electronic device including the loop heat pipe, and a method of manufacturing the loop heat pipe in each embodiment according to the present invention.

Figure 1B:
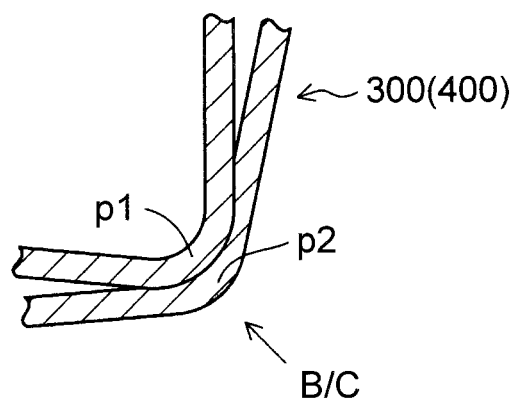
FIG. 1B is a cross sectional view illustrating a part of the loop heat pipe studied by the present inventors.

FIG. 1A is a perspective view illustrating a loop heat pipe studied by the present inventors, and FIG. 1B is a cross sectional view illustrating a part of the loop heat pipe studied by the present inventors.

A loop heat pipe illustrated in FIG. 1A, that is to be accommodated within an electronic device (not illustrated), includes an evaporator 100 and a condenser 200. A vapor pipe 300 and a liquid pipe 400 connect the evaporator 100 and the condenser 200 in a loop to form a loop-shaped passage. A working fluid flows through the loop-shaped passage.

The evaporator 100 is fixed on a heat generating component that generates heat. The evaporator 100 vaporizes the working fluid using the heat generated from the heat generating component, to generate vapor. The vapor passes through the vapor pipe 300 and is guided to the condenser 200 that liquefies the vapor, to generate liquid. The liquid passes through the liquid pipe 400 and is returned to the evaporator 100. Hence, the heat generated from the heat generating component is transferred to the condenser 200, to be dissipated to an outside.

The loop heat pipe may be manufactured by etching a plurality of flat copper layers, and stacking and bonding the etched copper layers, for example. In this case, the entire loop heat pipe has a planar structure.

For this reason, when the evaporator 100 of the loop heat pipe is fixed on the heat generating component within the electronic device, the evaporator 100 and the condenser 200 are arranged at the same height position.

However, in a case in which the heat needs to be dissipated to the outside by arranging the condenser 200 of the loop heat pipe at an opening in a side plate or a top plate of a casing of the electronic device, for example, the vapor pipe 300 and the liquid pipe 400 that connect the evaporator 100 and the condenser 200 need to be bent, as indicated by arrows B in FIG. 1A.

The flow passage inside each of the vapor pipe 300 and the liquid pipe 400 is a small rectangular hollow space in a cross sectional view. For this reason, when the vapor pipe 300 (or liquid pipe 400) is bent as illustrated in FIG. 1B, compressive stress is generated at a pipe wall p1 on an inner part relative to a bending direction, while tensile stress is generated at a pipe wall p2 on an outer part relative to the bending direction.

In this case, the pipe wall p1 on the inner part is pushed and moved toward the inside of the vapor pipe 300 (or liquid pipe 400), while the pipe wall p2 on the outer part is pulled and moved toward the inside of the vapor pipe 300 (or liquid pipe 400). As a result, the vapor pipe 300 (or liquid pipe 400) may be blocked or closed at a position indicated by an arrow B/C in FIG. 1B, to prevent the loop heat pipe from functioning properly.

The loop heat pipe, the electronic device including the loop heat pipe, and the method of manufacturing the heat pipe in the embodiments described hereinafter are designed to avoid blocking or closing of the pipe connecting the evaporator and the condenser even when the pipe is bent.

First Embodiment

Figure 2:
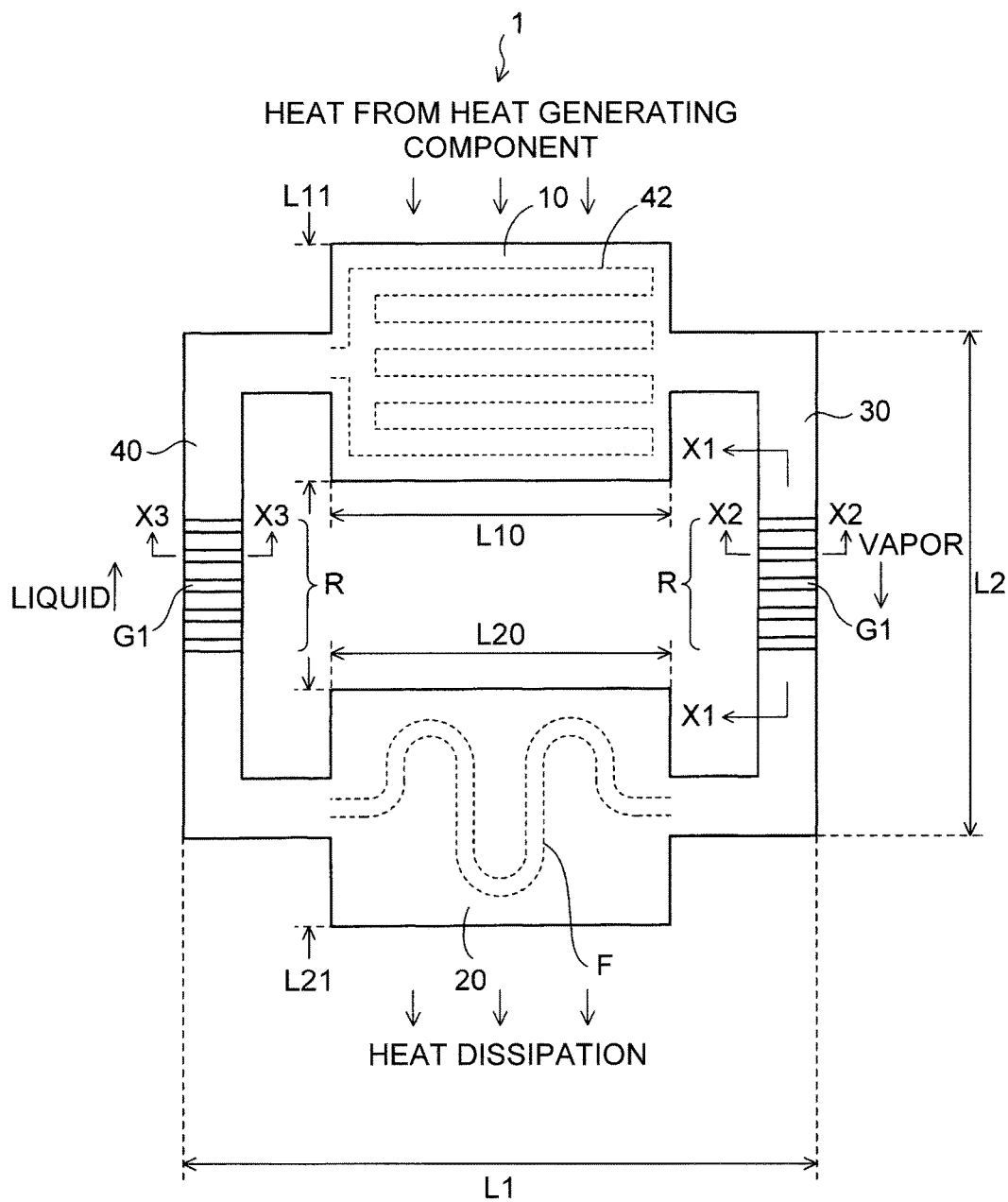
FIG. 2 is a plan view illustrating a loop heat pipe in a first embodiment.

FIG. 2 is a plan view, not drawn to scale, illustrating a loop heat pipe in a first embodiment. FIG. 3A through FIG. 5 are diagrams for explaining a vapor pipe and a liquid pipe of the loop heat pipe illustrated in FIG. 2. FIG. 6A through FIG. 7B are diagrams for explaining a method of manufacturing the loop heat pipe in this first embodiment.

As illustrated in FIG. 2, a loop heat pipe 1 in this first embodiment includes an evaporator 10 that vaporizes a working fluid using heat generated from a heat generating component, to generate vapor, and a condenser 20 that liquefies the vapor, to generate liquid. The loop heat pipe 1 further includes a vapor pipe 30 that connects the evaporator 10 and the condenser 20, and a liquid pipe 40 that connects the evaporator 10 and the condenser 20.

The vapor pipe 30 and the liquid pipe 40 connect the evaporator 10 and the condenser 20 in a loop to form a loop-shaped passage. The working fluid flows through the loop-shaped passage. A zigzag flow passage F is formed in the condenser 20, and one end of the zigzag flow passage F is connected to the vapor pipe 30, while the other end of the zigzag flow passage F is connected to the liquid pipe 40.

The evaporator 10 of the loop heat pipe 1 is fixed on the heat generating component that generates the heat. The evaporator 10 vaporizes the working fluid using the heat generated from the heat generating component, to generate vapor. The heat generating component may be a semiconductor chip, such as a CPU (Central Processing Unit) chip or the like, for example.

The temperature of the heat generating component decreases due to heat of vaporization when the working fluid is vaporized. In addition, the vapor passes through the vapor pipe 30, and is guided to the condenser 20 that liquefies the vapor. The heat absorbed at the evaporator 10 is dissipated to the outside from the condenser 20.

Accordingly, the heat generated from the heat generating component moves to the condenser 20, and is dissipated to the outside. The working fluid that is liquefied in the condenser 20 is returned to the evaporator 10 through the liquid pipe 40. The working fluid is not limited to a particular type of fluid. From a viewpoint of efficiently cooling the heat generating component by latent heat of vaporization, a fluid with a high vapor pressure and a large latent heat of vaporization is preferably used as the working fluid. Examples of such a fluid, preferably used as the working fluid, include ammonia, water, fluorocarbon, alcohol, and acetone, for example.

The loop heat pipe 1 illustrated in FIG. 2 may have the following dimensions, for example. The evaporator 10 may have a horizontal length L10 of approximately 5.0 cm, for example, and a vertical length L11 of approximately 3.0 cm, for example. The condenser 20 may have a horizontal length L20 of approximately 2.0 cm, for example, and a vertical length L21 of approximately 2.0 cm, for example. A horizontal length L1 of the loop heat pipe 1 may be approximately 8.0 cm, for example. A vertical length L2 of each of the vapor pipe 30 and the liquid pipe 40 may be approximately 10 cm, for example.

As described above, in a case in which the heat needs to be dissipated to the outside by arranging the condenser 20 of the loop heat pipe 1 illustrated in FIG. 2 at an opening in the side plate or the top plate of the casing of the electronic device, for example, the vapor pipe 30 and the liquid pipe 40 that connect the evaporator 10 and the condenser 20 need to be bent.

FIG. 2 illustrates the loop heat pipe 1 in a state before the vapor pipe 30 and the liquid pipe 40 are bent. In this state, the loop heat pipe 1 includes a region R to be worked (or machined) in each of the vapor pipe 30 and the liquid pipe 40. The vapor pipe 30 and the liquid pipe 40 are later bent at the respective regions R.

As illustrated in FIG. 2, in order to prevent the vapor pipe 30 and the liquid pipe 40 from becoming blocked or closed when the vapor pipe 30 and the liquid pipe 40 are bent, a plurality of first grooves G1 are formed in an outer surface of each of the vapor pipe 30 and the liquid pipe 40 in the region R of the loop heat pipe 1 in this first embodiment. Each first groove G1 extends linearly along a width direction of the corresponding one of the vapor pipe 30 and the liquid pipe 40. In the region R of each of the vapor pipe 30 and the liquid pipe 40, the first grooves G1 are successively formed at intervals along a direction intersecting (or crossing) the width direction.

Figure 3A:
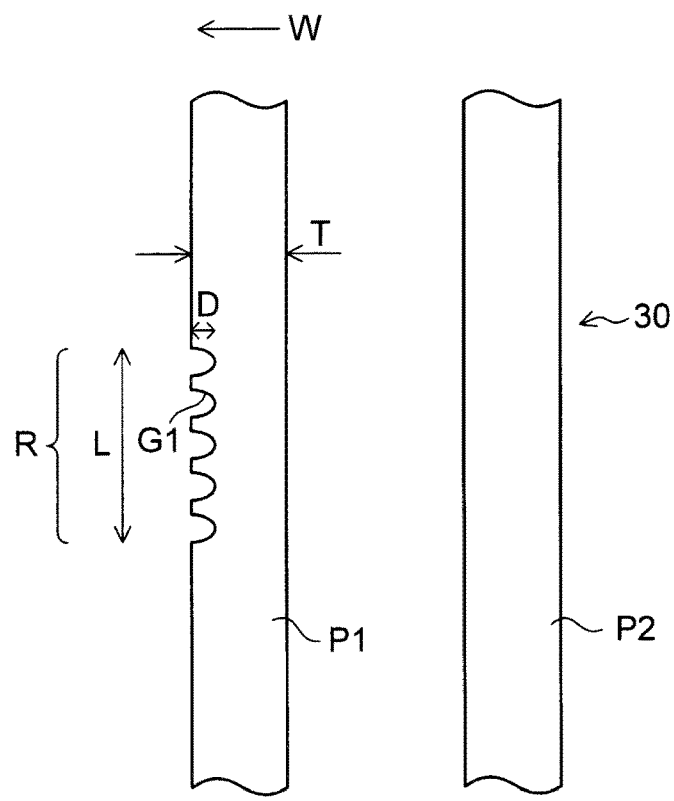
FIG. 3A is a cross sectional view illustrating a vapor pipe of the loop heat pipe along a line X1-X1 in FIG. 2.

FIG. 3A is a cross sectional view illustrating the vapor pipe 30 of the loop heat pipe 1 along a line X1-X1 in FIG. 2. A flow passage inside the vapor pipe 30 is a small rectangular hollow space in a cross sectional view taken along the width direction. FIG. 3A illustrates a pipe wall P1 on an upper surface side and a pipe wall P2 on a lower surface side of the vapor pipe 30 illustrated in FIG. 2.

As illustrated in FIG. 3A, in this first embodiment, the plurality of first grooves G1 are formed in the outer surface of the pipe wall P1, at an inner part relative to a bending direction W of the vapor pipe 30 within the region R. The first grooves G1 are formed to extend linearly in a direction intersecting the bending direction W. The direction intersecting the bending direction W is the same as the width direction of the vapor pipe 30 illustrated in FIG. 2.

Preferably, the first grooves G1 are formed to extend linearly in a direction perpendicular to the bending direction W. However, as long as the first grooves G1 are formed to extend linearly in the direction intersecting the bending direction W, an intersecting angle between the extending direction of each first groove G1 and the bending direction W may be slightly deviated from 90 degrees.

As illustrated in FIG. 3A, the pipe wall P1 of the vapor pipe 30 has a thickness T of approximately 0.1 mm, for example. The first groove G1 has a depth D of approximately 50 μm, for example. In addition, a length L of the region R in which the first grooves G1 are successively arranged is approximately 1 mm, for example.

Although not illustrated, the liquid pipe 40 has a structure similar to the structure of the vapor pipe 30 described above in conjunction with FIG. 3A. A plurality of first grooves G1 are formed in an outer surface of the pipe wall P1, at an inner part relative to a bending direction W of the liquid pipe 40 within the region R. The first grooves G1 of the liquid pipe 40 are formed to extend linearly in a direction intersecting the bending direction W. The direction intersecting the bending direction W is the same as a width direction of the liquid pipe 40 illustrated in FIG. 2. Preferably, the first grooves G1 of the liquid pipe 40 are formed to extend linearly in a direction perpendicular to the bending direction W. However, as long as the first grooves G1 of the liquid pipe 40 are formed to extend linearly in the direction intersecting the bending direction W, an intersecting angle between the extending direction of each first groove G1 and the bending direction W may be slightly deviated from 90 degrees.

The first grooves G1 are provided in the vapor pipe 30 and the liquid pipe 40 to relax or absorb deformation of the respective pipe walls P1 and insides of the pipes 30 and 40 caused by bending stress when the vapor pipe 30 and the liquid pipe 40 are bent. The depth D of the first groove G1, the number of first grooves G1 provided within the region R, the intervals (or pitch) at which the first grooves G1 are provided within the region R, or the like may be adjusted according to a bending angle of the vapor pipe 30 and the liquid pipe 40.

Accordingly, the first grooves G1 are formed in the outer surface of the pipe wall P1, at the inner part relative to the bending direction W of each of the vapor pipe 30 and the liquid pipe 40 within the region R. The first grooves G1 are formed to extend linearly in the direction intersecting the bending direction W.

Figure 4:
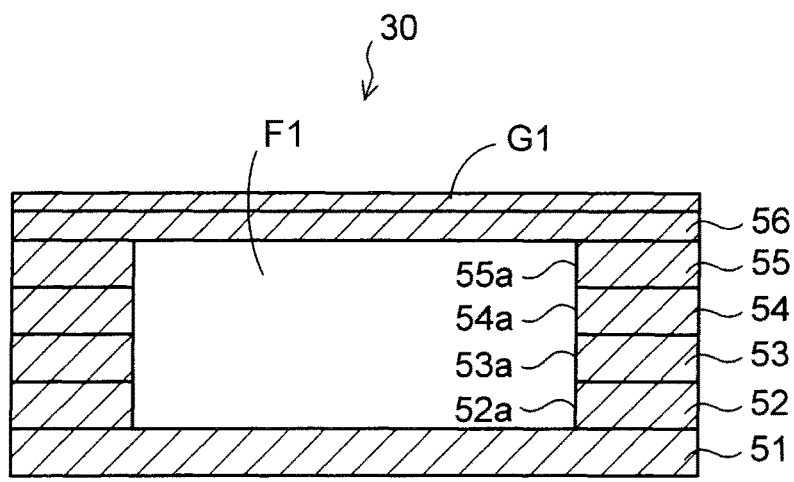
FIG. 4 is a cross sectional view illustrating the vapor pipe of the loop heat pipe along a line X2-X2 in FIG. 2.

FIG. 4 is a cross sectional view illustrating the vapor pipe 30 of the loop heat pipe 1 along a line X2-X2 in FIG. 2. As illustrated in FIG. 4, the vapor pipe 30 of the loop heat pipe 1 illustrated in FIG. 2 is formed by stacking six metal layers 51 through 56. By stacking the six metal layers 51 through 56, the evaporator 10, the condenser 20, the vapor pipe 30, and the liquid pipe 40 are formed simultaneously.

The six metal layers 51 through 56 are made of copper layers having a high thermal conductivity, for example, and are bonded together by diffusion bonding.

The first metal layer 51 is formed to the planar shape of the loop heat pipe 1 illustrated in FIG. 2. The second, third, fourth, and fifth metal layers 52, 53, 54, and 55 are stacked in a state in which openings 52a, 53a, 54a, and 55a are respectively formed therein.

In the vapor pipe 30, the openings 52a through 55a of the second through fifth metal layers 52 through 55 overlap and communicate with each other to form a flow passage F1 of the working fluid. As described above, the flow passage F1 inside the vapor pipe 30 is a small rectangular hollow space in the cross sectional view. For example, the flow passage F1 has a width of approximately 4 mm, and a height of approximately 0.4 mm.

The sixth metal layer 56 is formed to the planar shape of the loop heat pipe 1 illustrated in FIG. 2. The first grooves G1 described above are formed in an upper surface of the sixth metal layer 56.

Accordingly, the first grooves G1 are formed in an outer surface of the uppermost sixth metal layer 56. The sixth metal layer 56 is an example of a first metal layer that is arranged at a first outermost surface of the loop heat pipe 1.

The uppermost sixth metal layer 56 forms a part of the pipe wall defining the flow passage F1 formed inside the loop heat pipe 1. A region of the inner surface of the sixth metal layer 56 in contact with the flow passage F1, corresponding to the region R in which the first grooves G1 are formed, has a smooth surface.

Figure 5:
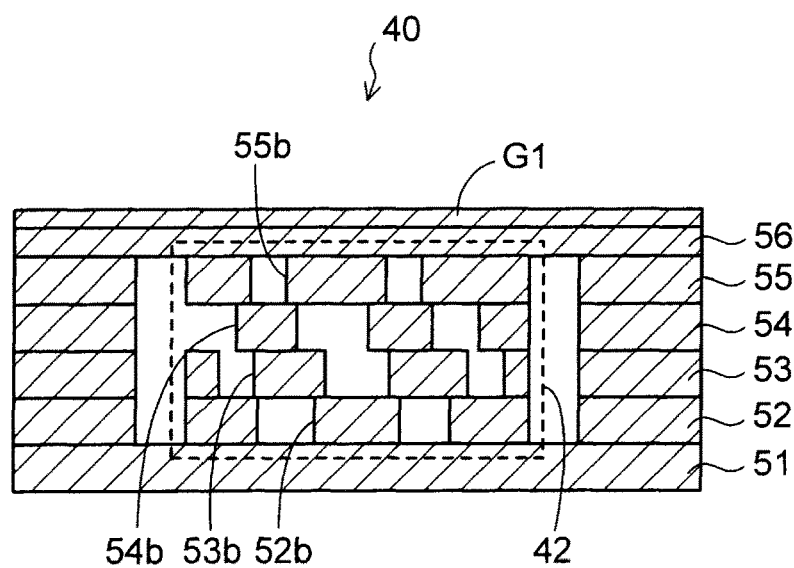
FIG. 5 is a cross sectional view illustrating a liquid pipe of the loop heat pipe along a line X3-X3 in FIG. 2.

FIG. 5 is a cross sectional view illustrating the liquid pipe 40 of the loop heat pipe 1 along a line X3-X3 in FIG. 2. As illustrated in FIG. 5 by a dotted line, a porous body 42 is provided inside the liquid pipe 40 of the loop heat pipe 1. The porous body 42 extends along the liquid pipe 40, and reaches the evaporator 10. The working fluid in liquid phase, inside the liquid pipe 40, is guided to the evaporator 10 by a capillary force generated by the porous body 42.

As illustrated in FIG. 5, the second, third, fourth, and fifth metal layers 52, 53, 54, and 55 are stacked in a state in which holes 52b, 53b, 54b, and 55b are respectively formed therein. The holes 52b through 55b penetrate the second through fifth metal layers 52 through 55, respectively. The holes 52b through 55b communicate with each other, but are arranged at overlapping positions that are deviated from each other in the plan view, to form micro-pore channels of the porous body 42.

The micro-pore channels of the porous body 42 spread three-dimensionally inside the porous body 42, and the working fluid spreads three-dimensionally within the micro-pore channels due to the capillary force.

By employing a structure that generates the capillary force in the liquid pipe 40 that returns the working fluid to the evaporator 10, a stable heat transfer can be made, even when the electronic device mounted with the loop heat pipe 1 is tilted.

In addition, the vapor that may back-stream from the evaporator 10 to the liquid pipe 40 will be pushed back by the capillary force of the porous body 42 acting on the working fluid, to prevent the back-streaming of the vapor.

Returning now to the description of FIG. 2, the porous body 42 is also provided inside the evaporator 10. The micro-pore channels of the porous body 42 inside the evaporator 10 communicate to the vapor pipe 30.

As described above, the loop heat pipe 1 has a structure in which the plurality of metal layers 51 through 56 are stacked.

Next, a description will be given of a process of bending the vapor pipe 30 and the liquid pipe 40 of the loop heat pipe 1 illustrated in FIG. 2.

Figure 3B:
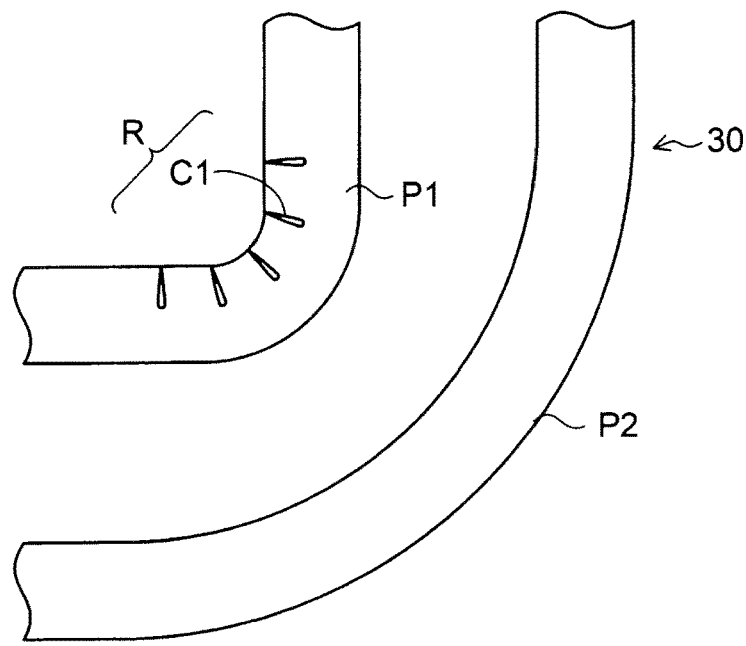
FIG. 3B is a cross sectional view illustrating the vapor pipe of the loop heat pipe illustrated in FIG. 3A in a state after bending.

FIG. 3B is a cross sectional view illustrating the vapor pipe 30 of the loop heat pipe 1 illustrated in FIG. 3A in a state after bending. As described above, the vapor pipe 30 illustrated in FIG. 3A in the state before being bent includes the first grooves G1 formed in the outer surface of the pipe wall P1, at the inner part relative to the bending direction W of the vapor pipe 30 within the region R.

For this reason, when the vapor pipe 30 illustrated in FIG. 3A is bent in the bending direction W as illustrated in FIG. 3B, the first grooves G1 formed in the outer surface of the pipe wall P1, at the inner part relative to the bending direction W of the vapor pipe 30 within the region R, are pushed by bending stress in a direction to close. Hence, opposing walls of each first groove G1 move closer to each other to positions close to each other, and may finally contact each other.

In the state illustrated in FIG. 3B, a cut part C1 is formed at a position where the first groove G1 formed in the outer surface of the pipe wall P1, at the inner part relative to the bending direction W of the vapor pipe 30 within the region R, closes. The cut part C1 is formed when the opposing walls of each first groove G1 move closer to each other to the positions close to each other, or to the positions contacting each other.

In the example illustrated in FIG. 3B, vertexes (open ends) of each first groove G1 contact each other, so that a slit remains inside the closed first groove G1.

Accordingly, the first grooves G1 of the vapor pipe 30 relax or absorb the deformation of the pipe wall P1 and the inside of the vapor pipe 30 caused by the bending stress when the vapor pipe 30 is bent. As a result, it is possible to reduce the amount of the pipe wall P1 moved toward the inside of the vapor pipe 30 due to the bending stress.

Consequently, even when the vapor pipe 30 is bent, the vapor pipe 30 will not be blocked or closed, and the flow passage F1 having a sufficiently large cross sectional area can be provided.

In addition, even when the vapor pipe 30 is bent, the inner surface of the vapor pipe 30, corresponding to the region R in which the first grooves G1 are formed, can maintain the smooth surface without irregularities or concavo-convexes. For this reason, it is possible prevent a fluid resistance of the working fluid from increasing within the flow passage F1.

The liquid pipe 40 may be bent simultaneously as when the vapor pipe 30 is bent. Because the first grooves G1 of the liquid pipe 40 are similar to the first grooves G1 of the vapor pipe 30, the liquid pipe 40 will not be blocked or closed when the liquid pipe 40 is bent, and a flow passage having a sufficiently large cross sectional area can be provided.

Next, a method of manufacturing the loop heat pipe in this first embodiment will be described.

Figure 6A:
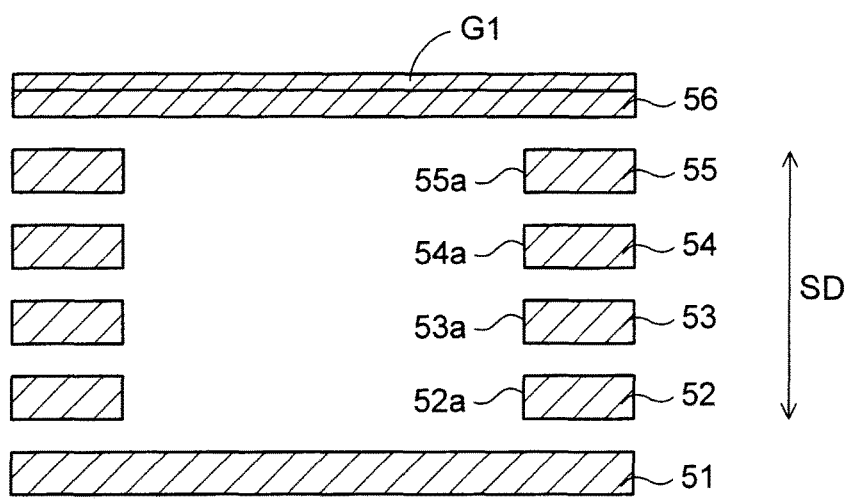
FIG. 6A and FIG. 6B respectively are a cross sectional view and a side view for explaining a method of manufacturing the loop heat pipe in the first embodiment.

First, a plurality of metal layers are prepared. Preferably, six metal layers, namely, the first through sixth metal layers 51 through 56 are prepared, as illustrated in FIG. 6A.

Each of the first through sixth metal layers 51 through 56 may be made of a copper layer having a thickness of approximately 0.1 mm, for example. The lowermost first metal layer 51 and the uppermost sixth metal layer 56 are formed to the planar shape of the loop heat pipe 1 illustrated in FIG. 2. As described above, the uppermost sixth metal layer 56 is an example of the first metal layer that is arranged at the first outermost surface of the loop heat pipe 1. On the other hand, the lowermost first metal layer 51 is an example of a second metal layer that is arranged at a second outermost surface of the loop heat pipe 1 opposite to the first outermost surface.

The openings 52a through 55a are formed in the second through fifth metal layers 52 through 55, respectively. The openings 52a through 55a are famed in the second through fifth metal layers 52 through 55 to form each of the evaporator 10, the condenser 20, the vapor pipe 30, and the liquid pipe 40 of the loop heat pipe 1 described above.

In addition, as described above in conjunction with FIG. 5, the holes 52b through 55b are formed in the second through fifth metal layers 52 through 55, respectively, to form the micro-pore channels of the porous body 42.

Furthermore, the first grooves G1 of the vapor pipe 30 and the liquid pipe 40 illustrated in FIG. 2 and FIG. 3A may be formed in advance in the upper surface of the sixth metal layer 56. The first grooves G1 may be formed in the upper surface of the uppermost sixth metal layer 56 within the region R, to extend linearly in the direction intersecting the bending direction W.

In the process of stacking the plurality of metal layers, the first grooves G1 may be formed in the outer surface of the metal layer arranged at the outermost surface of the loop heat pipe 1.

The first metal layer 51 and the sixth metal layer 56 may be patterned to the planar shape of the loop heat pipe 1 illustrated in FIG. 2.

In addition, the second through fifth metal layers 52 through 55 may be patterned to form the openings 52a through 55a illustrated in FIG. 4 and the holes 52b through 55b illustrated in FIG. 5.

A resist pattern layer may be formed on the metal layer by photolithography, and the resist pattern layer may be used as a mask to form the opening and the hole penetrating the metal layer by wet etching. Alternatively, the opening and the hole may be formed in the metal layer by performing the wet etching from both surfaces, that is, opposite surfaces of the metal layer.

The first grooves G1 may be formed in the upper surface of the uppermost sixth metal layer 56 by using the resist pattern layer as the mask, and performing the wet etching from the upper surface of the sixth metal layer 56 to an intermediate position along a thickness direction of the sixth metal layer 56.

In the case in which the first through sixth metal layers 51 through 56 are copper layers, a cupric chloride solution, a ferric chloride solution, or the like may be used as an etchant.

Alternatively, the first grooves G1 may be formed in the upper surface of the uppermost sixth metal layer 56 by laser processing or laser beam machining. For example, the laser used by the laser processing or laser beam machining may be carbon dioxide ($CO_2$) laser.

The first through sixth metal layers 51 through 56 described above may be stacked and pressed while being heated to a temperature of 900° C., for example, so that the first through sixth metal layers 51 through 56 are bonded to each other by diffusion bonding, using diffusion of atoms generated at bonding surfaces.

Hence, it is possible to form the evaporator 10, the condenser 20, the vapor pipe 30 that connects the evaporator 10 and the condenser 20, and the liquid pipe 40 that connects the evaporator 10 and the condenser 20, described above in conjunction with FIG. 2.

Figure 6B:
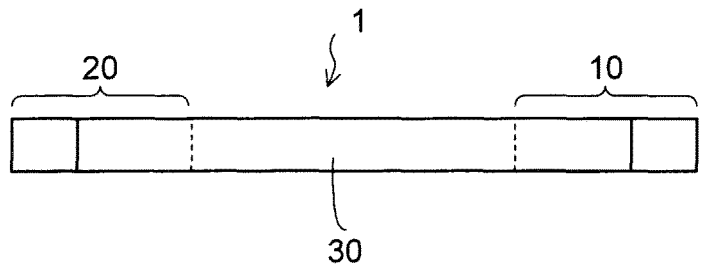

By the above described processes, it is possible to manufacture the loop heat pipe 1 illustrated in FIG. 6B having the planar structure in its entirety. The loop heat pipe 1 illustrated in FIG. 6B corresponds to a side view of the loop heat pipe 1 illustrated in the plan view of FIG. 2 viewed in a horizontal direction from an end provided with the vapor pipe 30.

Figure 7A:
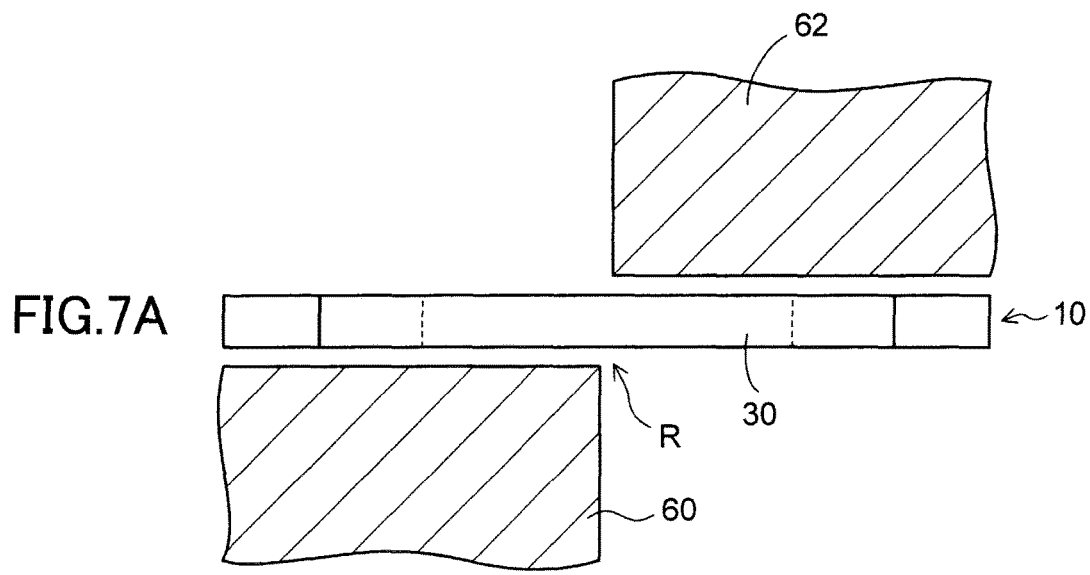
FIG. 7A and FIG. 7B respectively are a cross sectional view and a side view for explaining the method of manufacturing the loop heat pipe in the first embodiment.

Next, as illustrated in FIG. 7A, a holding member 60 and a punch 62 are prepared as molds. The loop heat pipe 1 illustrated in FIG. 6B is arranged upside-down, and in a state in which the surface formed with the first grooves G1 (not illustrated) faces downward, the loop heat pipe 1 is placed on the holding member 60.

In this state, the loop heat pipe 1 is arranged on the holding member 60, so that the region R in which the first grooves G1 of the vapor pipe 30 are arranged and the region R in which the first grooves G1 of the liquid pipe 40 are arranged are respectively positioned at an end part of the holding member 60. Preferably, a central part of the region R of each of the vapor pipe 30 and the liquid pipe 40 is positioned at an edge part of the holding member 60.

Further, the punch 62 pushes downward on a part of the loop heat pipe 1 overhanging from the end part of the holding member 60, to bend the vapor pipe 30 and the liquid pipe 40 at the respective regions R.

Figure 7B:
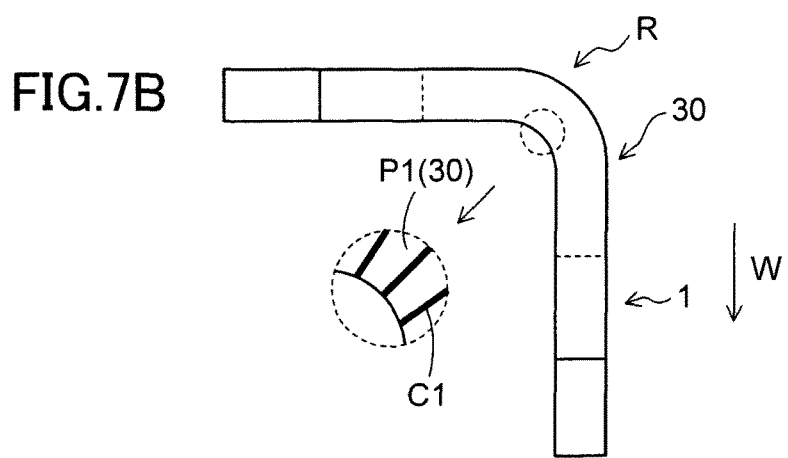

As a result, the loop heat pipe 1 is bent at the regions R of the vapor pipe 30 and the liquid pipe 40, as illustrated in FIG. 7B. The vapor pipe 30 and the liquid pipe 40 of the loop heat pipe 1 are not blocked or closed when the vapor pipe 30 and the liquid pipe 40 are bent at the respective region R, as described above in conjunction with FIG. 3B.

In addition, as illustrated in FIG. 7B in which a part of the region R surrounded by a dotted circle is illustrated on an enlarged scale, the cut part C1 is formed at the position where the first groove G1 formed in the outer surface of the pipe wall P1, at the inner part relative to the bending direction W of the vapor pipe 30 within the region R, closes when the vapor pipe 30 is bent.

Accordingly, each of the vapor pipe 30 and the liquid pipe 40 is bent at the region R where the first grooves G1 are formed, so that the first grooves G1 are positioned at the inner part relative to the bending direction W of each of the vapor pipe 30 and the liquid pipe 40, and a bend line direction is approximately parallel to the first grooves G1. The bend line direction is generated on the outer surface of each of the vapor pipe 30 and the liquid pipe 40, and is the same as the width direction of each of the vapor pipe 30 and the liquid pipe 40.

Alternatively, although not illustrated, the molds that are used may include a lower mold having a V-shaped recess with a predetermined V-angle in an upper surface in the cross sectional view, and an upper mold having a V-shaped protrusion that fits the V-shaped recess of the lower mold.

In this case, the loop heat pipe 1 is interposed between the upper mold and the lower mold, with the first grooves G1 facing up. By pressing the upper mold against the lower mold, the vapor pipe 30 and the liquid pipe 40 may be bent in correspondence with the V-shaped recess of the lower mold.

When the height positions of the evaporator 10 and the condenser 20 are to be changed in the state in which the evaporator 10 and the condenser 20 are arranged in the horizontal direction, molds may be used to bent each of the vapor pipe 30 and the liquid pipe 40 of the loop heat pipe 1 at two positions.

The vapor pipe 30 and the liquid pipe 40 may be bent by pressing using the molds, so that the evaporator 10 and the condenser 20 of the loop heat pipe 1 are arranged at the desired height positions.

Second Embodiment

Figure 8A:
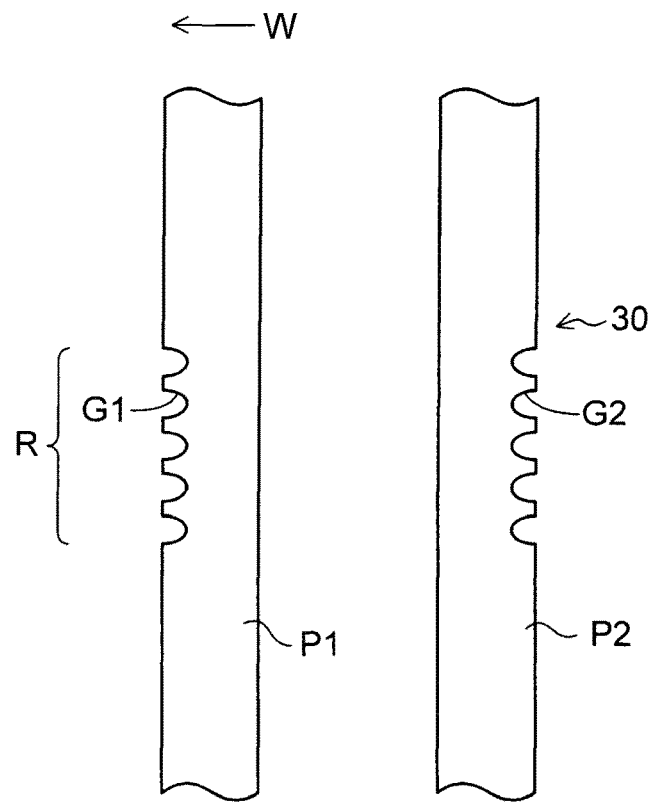
FIG. 8A is a cross sectional view illustrating grooves of the vapor pipe of the loop heat pipe in a second embodiment.
Figure 8B:
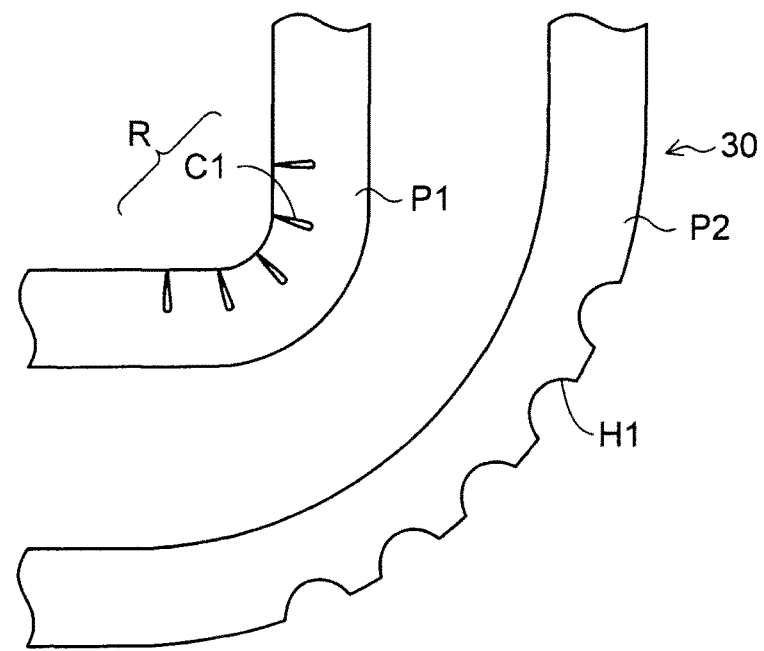
FIG. 8B is a cross sectional view illustrating the vapor pipe of the loop heat pipe illustrated in FIG. 8A in a state after bending.
Figure 9:
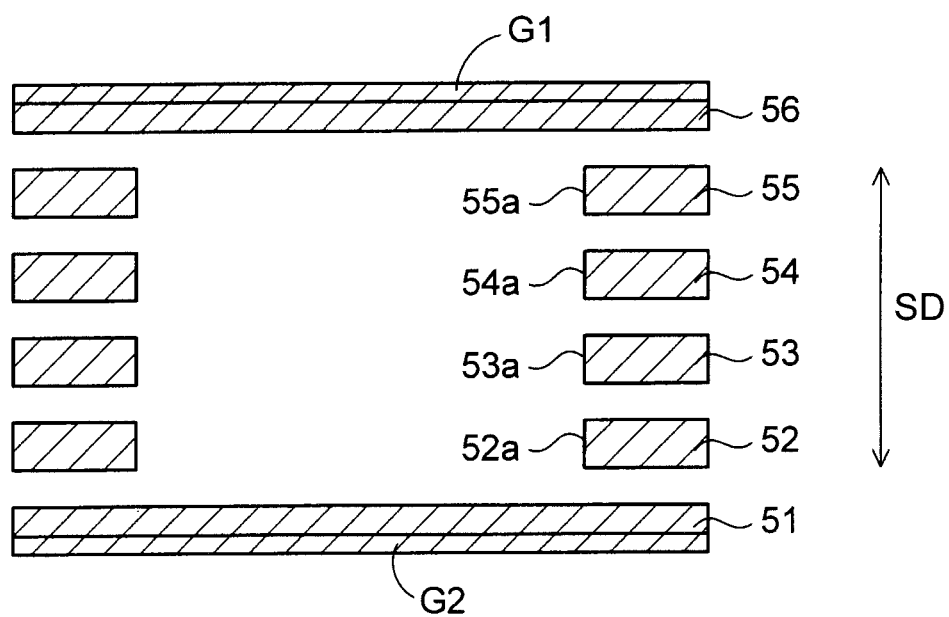
FIG. 9 is a cross sectional view for explaining the method of manufacturing the loop heat pipe in the second embodiment.

FIG. 8A is a cross sectional view illustrating grooves of the vapor pipe of the loop heat pipe in a second embodiment, and FIG. 8B is a cross sectional view illustrating the vapor pipe of the loop heat pipe illustrated in FIG. BA in a state after bending. FIG. 9 is a cross sectional view for explaining the method of manufacturing the loop heat pipe in this second embodiment.

In this second embodiment, a detailed description of constituent elements of the loop heat pipe that are the same as those of the loop heat pipe in the first embodiment will be omitted. In addition, in this second embodiment, a detailed description of processes of the method of manufacturing the loop heat pipe that are the same as those of the method of manufacturing the loop heat pipe in the first embodiment will be omitted.

As illustrated in FIG. BA, in the vapor pipe 30 of the loop heat pipe 1 in the first embodiment illustrated in FIG. 3A, a plurality of second grooves G2 are also formed in the outer surface of the pipe wall P2, at the outer part relative to the bending direction W of the vapor pipe 30 within the region R in this second embodiment. The second grooves G2 are formed to extend linearly in a direction intersecting the bending direction W. The direction intersecting the bending direction W is the same as the width direction of the vapor pipe 30. In the region R of the vapor pipe 30, the second grooves G2 are successively formed at intervals along a direction intersecting (or crossing) the width direction. Further, in the loop heat pipe 1 illustrated in FIG. 2, a plurality of second grooves G2 are similarly also formed in the liquid pipe 40 within the region R in this second embodiment.

The first grooves G1 and the second grooves G2 extend linearly along the width direction of each of the vapor pipe 30 and the liquid pipe 40.

Hence, in this second embodiment, the second grooves G2 extending linearly in the direction intersecting the bending direction W are additionally formed in the outer surface of the pipe wall P2, at the outer part relative to the bending direction W of each of the vapor pipe 30 and the liquid pipe 40 within the region R.

The second grooves G2 are formed in the outer surface of the lowermost first metal layer 51 illustrated in FIG. 4, at positions overlapping the region in which the first grooves G1 are formed. As described above, the lowermost first metal layer 51 is an example of the second metal layer that is arranged at the second outermost surface of the loop heat pipe 1 opposite to the first outermost surface.

The lowermost first metal layer 51 illustrated in FIG. 4 forms a part of the pipe wall defining the flow passage F1 formed inside the loop heat pipe 1. A region of the inner surface of the first metal layer 51 in contact with the flow passage F1, corresponding to the region R in which the first grooves G2 are formed, has a smooth surface.

For this reason, when the vapor pipe 30 illustrated in FIG. 8A is bent in the bending direction W as illustrated in FIG. 8B, the first grooves G1 formed in the outer surface of the pipe wall P1, at the inner part relative to the bending direction W of the vapor pipe 30 within the region R, are pushed by the bending stress in the direction to close, similarly as in the case of the first embodiment. The cut part C1 is formed when the opposing walls of each first groove G1 move closer to each other to the positions close to each other, or to the positions contacting each other.

At the same time, the second grooves G2 formed in the outer surface of the pipe wall P2, at the outer part relative to the bending direction W of the vapor pipe 30 within the region R, are pulled by the bending stress in the direction to open. Hence, each second groove G2 is stretched along the width direction of the second groove G2 and widened, to form a first cavity H1. A width of the first cavity H1 is wider than the width of the second groove G2 before the vapor pipe 30 is bent. A depth of the first cavity H1 is shallower than the depth of the second groove G2 before the vapor pipe 30 is bent.

Accordingly, the compressive stress generated at the pipe wall P1 on the inner part relative to the bending direction W of the vapor pipe 30 is relaxed or absorbed, and the amount of the pipe wall P1 on the inner part relative to the bending direction W of the vapor pipe 30, pushed and moved toward the inside of the pipe by the bending stress, is reduced.

In other words, compared to the case in which the second grooves G2 are not formed, the pipe wall P2 on the outer part relative to the bending direction W can be deformed in a tensile stress direction by a smaller stress. Consequently, the stress acting on the pipe wall P1 on the inner part relative to the bending direction W decreases, to relax or absorb the deformation of the pipe wall P1.

Further, in this second embodiment, the deformation toward the inside of the pipe by the tensile stress at the pipe wall P2 on the outer part relative to the bending direction W of the vapor pipe 30 is relaxed or absorbed, and the amount of the pipe wall P2 on the outer part relative to the bending direction W of the vapor pipe 30, pushed and moved toward the inside of the pipe by the bending stress, is reduced.

Hence, even when the vapor pipe 30 is bent, the vapor pipe 30 will not be blocked or closed, and the flow passage F1 having the sufficiently large cross sectional area can be provided.

In addition, even when the vapor pipe 30 is bent, the inner surface of the vapor pipe 30, corresponding to the region R in which the first and second grooves G1 and G2 are formed, can maintain the smooth surface without irregularities or concavo-convexes. For this reason, it is possible prevent the fluid resistance of the working fluid from increasing within the flow passage F1.

The liquid pipe 40 may be bent simultaneously as when the vapor pipe 30 is bent. Because the first and second grooves G1 and G2 of the liquid pipe 40 are similar to the first and second grooves G1 and G2 of the vapor pipe 30, the liquid pipe 40 will not be blocked or closed when the liquid pipe 40 is bent, and a flow passage having a sufficiently large cross sectional area can be provided.

In this second embodiment, the amount of the pipe wall P1 on the inner part relative to the bending direction W of each of the vapor pipe 30 and the liquid pipe 40, and the amount of the pipe wall P2 on the outer side relative to the bending direction W of each of the vapor pipe 30 and the liquid pipe 40, pushed and moved toward the inside of each pipe by the bending stress, are reduced. For this reason, a flow passage having a larger cross sectional area can be provided in the region R of each of the vapor pipe 30 and the liquid pipe 40, when compared to the first embodiment.

Next, a method of manufacturing the loop heat pipe in this second embodiment will be described. As illustrated in FIG. 9, the second grooves G2 arranged in the outer surface of the pipe wall P2 illustrated in FIG. 8A are additionally formed in the lower surface of the first metal layer 51, in the method of manufacturing the loop heat pipe in the first embodiment described above in conjunction with FIG. 6A.

In other words, the second grooves G2 are additionally formed in the direction intersecting the bending direction W, in the region R of the lower surface of the lowermost first metal layer 51.

In this state, the first through sixth metal layers 51 through 56 are stacked and bonded, and processes similar to the processes described above in conjunction with FIG. 7A and FIG. 7B are performed, to manufacture the loop heat pipe 1 in this second embodiment.

Third Embodiment

Figure 10A:
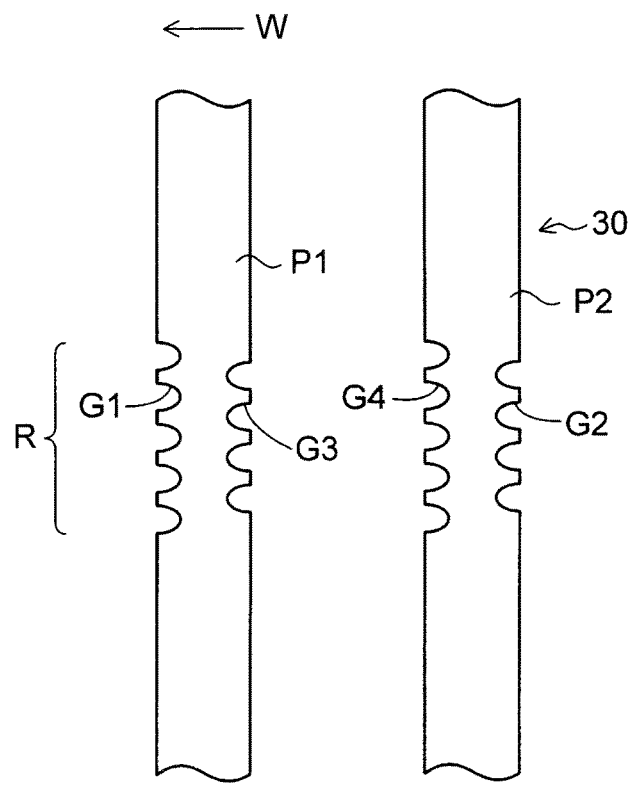
FIG. 10A is a cross sectional view illustrating the grooves of the vapor pipe of the loop heat pipe in a third embodiment.
Figure 10B:
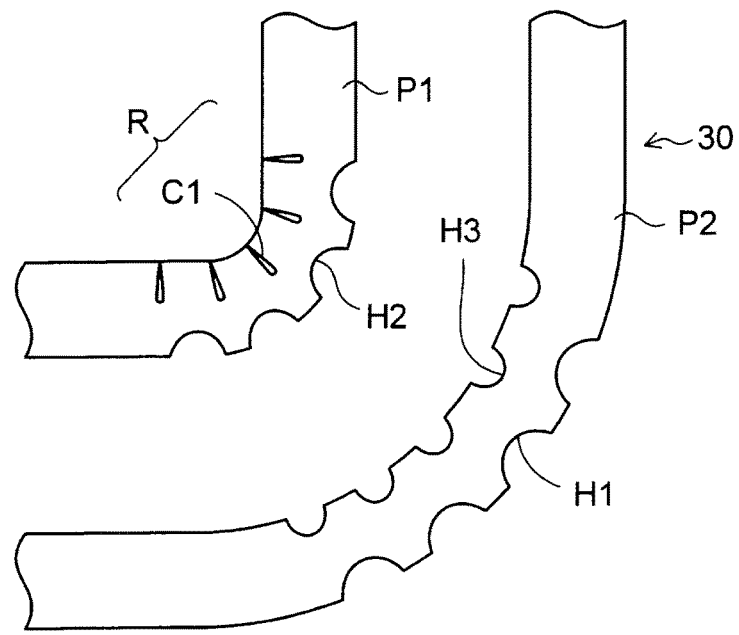
FIG. 10B is a cross sectional view illustrating the vapor pipe of the loop heat pipe illustrated in FIG. 10A in a state after bending.
Figure 11:
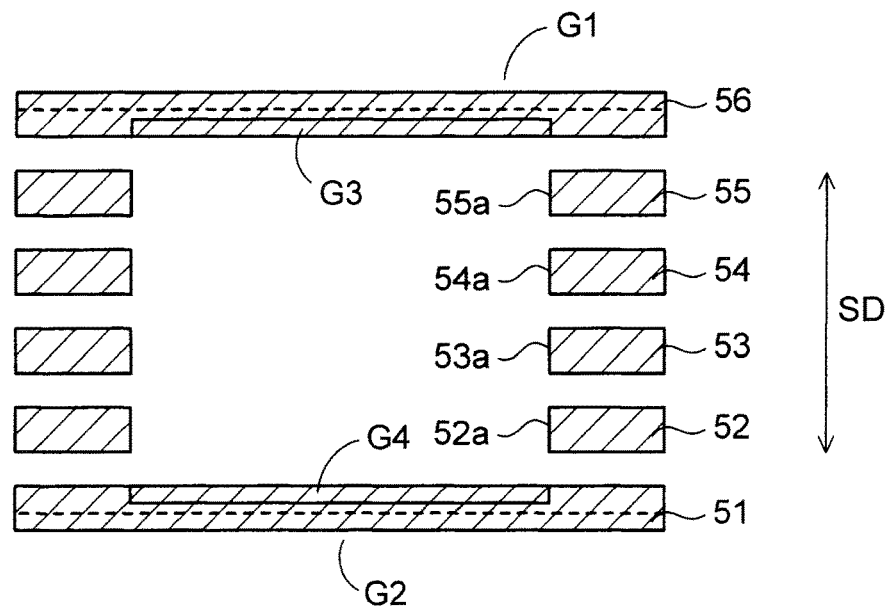
FIG. 11 is a cross sectional view for explaining the method of manufacturing the loop heat pipe in the third embodiment.

FIG. 10A is a cross sectional view illustrating the grooves of the vapor pipe of the loop heat pipe in a third embodiment, and FIG. 10B is a cross sectional view illustrating the vapor pipe of the loop heat pipe illustrated in FIG. 10A in a state after bending. FIG. 11 is a cross sectional view for explaining the method of manufacturing the loop heat pipe in this third embodiment.

In this third embodiment, a detailed description of constituent elements of the loop heat pipe that are the same as those of the loop heat pipe in the first and second embodiments will be omitted. In addition, in this third embodiment, a detailed description of processes of the method of manufacturing the loop heat pipe that are the same as those of the method of manufacturing the loop heat pipe in the first and second embodiments will be omitted.

As illustrated in FIG. 10A, in the vapor pipe 30 of the loop heat pipe 1 in the second embodiment illustrated in FIG. 8A, a plurality of third grooves G3 are also formed in the inner surface of the pipe wall P1, at the inner part relative to the bending direction W of the vapor pipe 30 within the region R in this third embodiment. The third grooves G3 are formed to extend linearly in a direction intersecting the bending direction W.

In the region R of the vapor pipe 30, the third grooves G3 are successively formed at intervals along a direction intersecting (or crossing) the width direction. Further, the third groove G3 formed in the inner surface of the pipe wall P1 of the vapor pipe 30 is arranged in a part corresponding to a region between two mutually adjacent first grooves G1 formed in the outer surface of the pipe wall P1 of the vapor pipe 30. Hence, the first grooves G1 and the third grooves G3 are alternately arranged in the direction intersecting the width direction.

By alternately arranging the first grooves G1 and the third grooves G3 in the direction intersecting the width direction, a remaining thickness of the pipe wall P1 that is substantially thicker can be provided when compared to a case in which the first grooves G1 and the third grooves G3 are formed at the same corresponding positions along the direction intersecting the width direction. For this reason, a certain strength of the vapor pipe 30 can be provided after the vapor pipe 30 is bent.

The uppermost sixth metal layer 56 (the example of the first metal layer that is arranged at the first outermost surface of the loop heat pipe 1) forms a part of the pipe wall defining the flow passage F1 formed inside the loop heat pipe 1 illustrated in FIG. 4. A region of the inner surface of the sixth metal layer 56 in contact with the flow passage F1, corresponding to the region R in which the first grooves G1 are formed, has the third grooves G3 formed parallel to the first grooves G1 at positions not overlapping positions of the first grooves G1.

In addition, as illustrated in FIG. 10A, in the vapor pipe 30 of the loop heat pipe 1 in the second embodiment illustrated in FIG. 8A, a plurality of fourth grooves G4 are also formed in the inner surface of the pipe wall P2, at the outer part relative to the bending direction W of the vapor pipe 30 within the region R in this third embodiment. The fourth grooves G4 are formed to extend linearly in a direction intersecting the bending direction W.

In the pipe wall P2 of the vapor pipe 30, the second grooves G2 in the outer surface and the fourth grooves G4 in the inner surface are alternately arranged in the direction intersecting the width direction.

Further, the third grooves G3 and the fourth grooves G4 are also formed in the liquid pipe 40 of the loop heat pipe 1 illustrated in FIG. 2.

Hence, in this third embodiment, the third grooves G3 extending linearly in the direction intersecting the bending direction W are additionally formed in the inner surface of the pipe wall P1, at the inner part relative to the bending direction W of each of the vapor pipe 30 and the liquid pipe 40 within the region R.

Further, the fourth grooves G4 extending linearly in the direction intersecting the bending direction W are additionally formed in the inner surface of the pipe wall P2, at the inner part relative to the bending direction W of each of the vapor pipe 30 and the liquid pipe 40 within the region R.

The lowermost first metal layer 51 (the example of the second metal layer that is arranged at the second outermost surface of the loop heat pipe 1) forms a part of the pipe wall defining the flow passage F1 formed inside the loop heat pipe 1 illustrated in FIG. 4. A region of the inner surface of the sixth metal layer 56 in contact with the flow passage F1, corresponding to the region R in which the second grooves G2 are formed, has the fourth grooves G4 formed parallel to the first grooves G1 at positions not overlapping positions of the second grooves G2.

For this reason, when the vapor pipe 30 illustrated in FIG. 10A is bent in the bending direction W as illustrated in FIG. 10B, the first grooves G1 formed in the outer surface of the pipe wall P1, at the inner part relative to the bending direction W of the vapor pipe 30 within the region R, are pushed by the bending stress in the direction to close, similarly as in the case of the first embodiment. The cut part C1 is formed when the opposing walls of each first groove G1 move closer to each other to the positions close to each other, or to the positions contacting each other.

At the same time, the third grooves G3 formed in the inner surface of the pipe wall P1, at the inner part relative to the bending direction W of the vapor pipe 30 within the region R, are pulled by the bending stress in the direction to open. Hence, each third groove G3 is stretched along the width direction of the third groove G3 and widened, to form a second cavity H2. A width of the second cavity H2 is wider than the width of the third groove G3 before the vapor pipe 30 is bent. A depth of the second cavity H2 is shallower than the depth of the third groove G3 before the vapor pipe 30 is bent.

Accordingly, the compressive stress generated at the pipe wall P1 on the inner part relative to the bending direction W of the vapor pipe 30 is relaxed or absorbed, and the amount of the pipe wall P1 on the inner part relative to the bending direction W of the vapor pipe 30, pushed and moved toward the inside of the pipe by the bending stress, is further reduced when compared to the first and second embodiments.

In addition, when the vapor pipe 30 illustrated in FIG. 10A is bent in the bending direction W as illustrated in FIG. 10B, the second grooves G2 formed in the outer surface of the pipe wall P2, at the outer part relative to the bending direction W of the vapor pipe 30 within the region R, are pulled by the bending stress in the direction to open. Hence, each second groove G2 is stretched along the width direction of the second groove G2 and widened, to form the first cavity H2, similarly as in the case of the second embodiment.

Furthermore, in this third embodiment, the fourth grooves G4 formed in the inner surface of the pipe wall P2, at the inner part relative to the bending direction W of the vapor pipe 30 within the region R, are pulled by the bending stress in the direction to open. Hence, each fourth groove G4 is stretched along the width direction of the fourth groove G4 and widened, to form a third cavity H3.

Accordingly, the pipe wall P2 on the outer part relative to the bending direction W can easily be deformed in the tensile stress direction. Consequently, the amount of the pipe wall P2 on the outer part relative to the bending direction W of the vapor pipe 30, pushed and moved toward the inside of the pipe by the bending stress, is further reduced when compared to the first and second embodiments.

The liquid pipe 40 may be bent simultaneously as when the vapor pipe 30 is bent. Because the first, second, third, and fourth grooves G1, G2, G3, and G4 of the liquid pipe 40 are similar to the first, second, third, and fourth grooves G1, G2, G3, and G4 of the vapor pipe 30, the liquid pipe 40 will not be blocked or closed when the liquid pipe 40 is bent, and a flow passage having a sufficiently large cross sectional area can be provided.

In this third embodiment, the first grooves G1 and the third grooves G3 are respectively formed in the outer surface and the inner surface of the pipe wall P1 on the inner part relative to the bending direction W of the vapor pipe 30. In addition, the second grooves G2 and the fourth grooves G4 are respectively formed in the outer surface and the inner surface of the pipe wall P2 on the outer part relative to the bending direction W of the vapor pipe 30. Furthermore, the first, second, third, and fourth grooves G1, G2, G3, and G4 are similarly formed in the inner and outer surfaces of the pipe walls P1 and P2 in the region R of the liquid pipe 40.

Hence, the amount of the pipe wall P1 on the inner part relative to the bending direction W of each of the vapor pipe 30 and the liquid pipe 40, and the amount of the pipe wall P2 on the outer side relative to the bending direction W of each of the vapor pipe 30 and the liquid pipe 40, pushed and moved toward the inside of each pipe by the bending stress, are reduced.

For this reason, a flow passage having a larger cross sectional area can be provided in the region R of each of the vapor pipe 30 and the liquid pipe 40, when compared to the second embodiment.

In this third embodiment, when the vapor pipe 30 is bent as illustrated in FIG. 10B, the second cavities H2 having the width stretched from the width of the third grooves G3 remain in the inner surface of the pipe wall P1 of the vapor pipe 30. As a result, the inner surface of the pipe wall P1 in the region R becomes a curved surface including concavo-convexes.

In addition, the third cavities H3 having the width stretched from the width of the fourth grooves G4 remain in the inner surface of the pipe wall P2 of the vapor pipe 30. As a result, the inner surface of the pipe wall P2 in the region R becomes a curved surface including concavo-convexes.

Consequently, the fluid resistance of the working fluid in the region R of the vapor pipe 30 becomes slightly higher than those of the first and second embodiments.

However, in this third embodiment, the second cavities H2 are formed in the thickness direction from the inner surface of the pipe wall P1 of the vapor pipe 30. In addition, the third cavities H3 are formed in the thickness direction from the inner surface of the pipe wall P2 of the vapor pipe 30.

In this case, compared to a case in which projections project from the inner surface of the pipe wall, the working fluid experiences less obstructions, to enable a smooth flow of the working fluid such that only a slight increase in the fluid resistance occurs.

Next, a method of manufacturing the loop heat pipe in this third embodiment will be described. As illustrated in FIG. 11, the third grooves G3 arranged in the inner surface of the pipe wall P1 illustrated in FIG. 10A are additionally formed in the lower surface of the sixth metal layer 56, in the method of manufacturing the loop heat pipe in the second embodiment described above in conjunction with FIG. 9.

In addition, in FIG. 9 described above, the fourth grooves G4 arranged in the inner surface of the pipe wall P2 on the outer part relative to the bending direction W illustrated in FIG. 10A are additionally formed in the upper surface of the first metal layer 51.

Hence, the third grooves G3 are additionally formed in the direction intersecting the bending direction W, in the region R of the lower surface of the uppermost sixth metal layer 56.

Further, the fourth grooves G4 are additionally formed in the direction intersecting the bending direction W, in the region R of the upper surface of the lowermost first metal layer 51.

The third grooves G3 in the inner surface of the sixth metal layer 56 and the fourth grooves G4 in the inner surface of the first metal layer 51 illustrated in FIG. 11 are only formed on the inner part of bonded parts where the first through sixth metal layers 51 through 56 are mutually bonded. For this reason, the sealing performance of the working fluid flowing inside the pipes can be maintained, to prevent a fluid leak.

In this state, the first through sixth metal layers 51 through 56 are stacked and bonded, and processes similar to the processes described above in conjunction with FIG. 7A and FIG. 7B are performed, to manufacture the loop heat pipe 1 in this third embodiment.

[Application Examples of Loop Heat Pipe in Embodiments]

Figure 12:
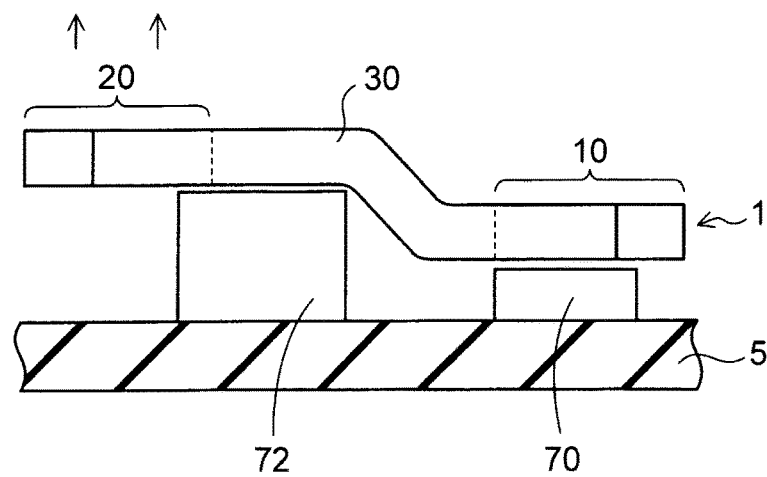
FIG. 12 is a cross sectional view illustrating a first application example of the loop heat pipe.

Next, an example in which a bent loop heat pipe is applied to an electronic apparatus will be described. FIG. 12 is a cross sectional view illustrating a first application example of the loop heat pipe in one embodiment. As illustrated in FIG. 12, a semiconductor chip 70, that is an example of the heat generating component, is mounted on a substrate 5 of the electronic device.

An electronic component 72 is mounted on the substrate 5 at a position to the left of the semiconductor chip 70 in FIG. 12. The electronic component 72 as a height that is higher than a height of the semiconductor chip 70.

Hence, in order to fix the evaporator 10 of the loop heat pipe 1 on the semiconductor chip 70 and horizontally arrange the condenser 20 on the electronic component 72 without tilting the condenser 20, the vapor pipe 30 and the liquid pipe 40 need to be bent upwards from the evaporator 10 toward the condenser 20 as illustrated in FIG. 12.

In this first application example, the vapor pipe 30 and the liquid pipe 40 are bent at two positions, in order to adjust the height positions of the evaporator 10 and the condenser 20 that are arranged in the horizontal direction.

The heat generated from the semiconductor chip 70 is transferred via the evaporator 10 and the vapor pipe 30, and dissipated to the outside from the condenser 20.

Because the porous body 42 is arranged in the liquid pipe 40 and the evaporator 10 of the loop heat pipe 1 in this embodiment, the working fluid can be stably transported by the capillary force, even when the height positions of the evaporator 10 and the condenser 20 from the substrate 5 differ.

Figure 13:
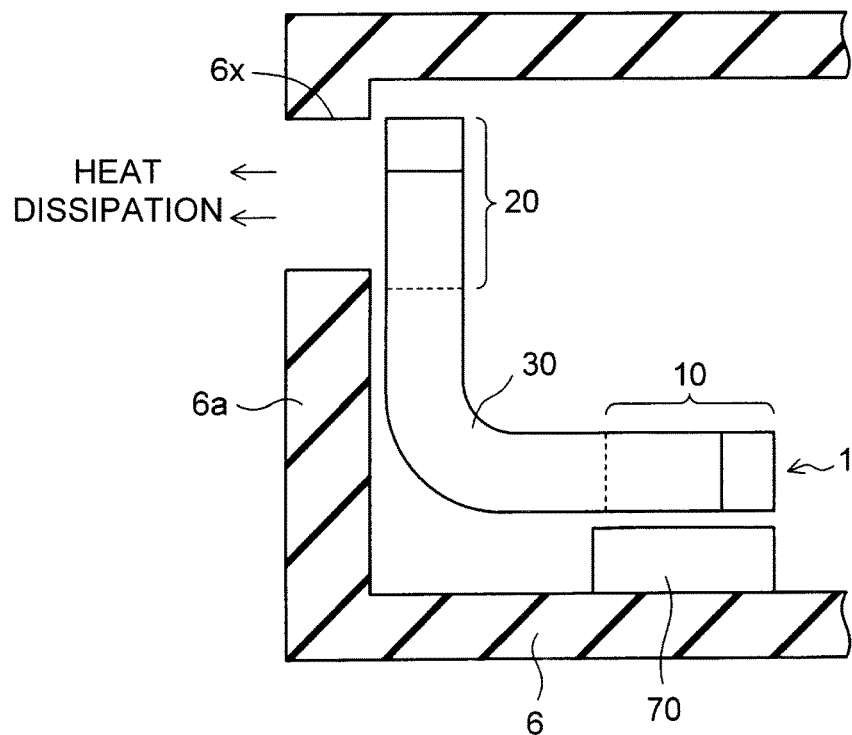
FIG. 13 is a cross sectional view illustrating a second application example of the loop heat pipe.

FIG. 13 is a cross sectional view illustrating a second application example of the loop heat pipe in one embodiment. As illustrated in FIG. 13, in the second application example, the condenser 20 is arranged beside an opening 6x in a side plate 6a of a casing 6 of the electronic device.

Hence, the vapor pipe 30 and the liquid pipe 40 of the loop heat pipe 1 are bent in a vertical direction in an L-shape, and the condenser 20 is arranged vertically. The evaporator 10 of the loop heat pipe 1 is fixed on the semiconductor chip 70, and the condenser 20 is arranged in a vicinity of the opening 6x of the side plate 6a on the inner part of the casing 6.

In this second application example, the heat generated from the semiconductor chip 70 is transferred via the evaporator 10 and the vapor pipe 30, and moves to the condenser 20. The heat is thus dissipated from the condenser 20 to the outside through the opening 6x in the side plate 6a of the casing 6.

Figure 14:
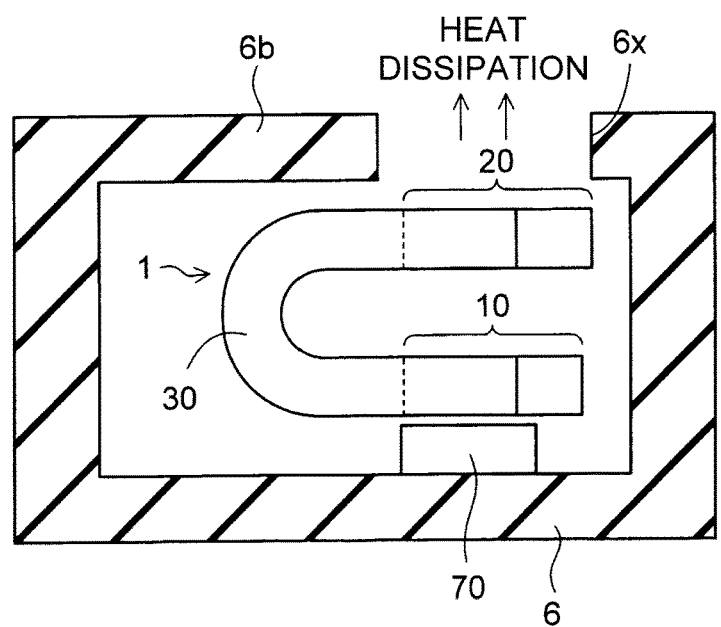
FIG. 14 is a cross sectional view illustrating a third application example of the loop heat pipe.

FIG. 14 is a cross sectional view illustrating a third application example of the loop heat pipe in one embodiment. As illustrated in FIG. 14, in the third application example, the condenser 20 is arranged under an opening 6x in a top plate 6b of the casing 6 of the electronic device.

Hence, the vapor pipe 30 and the liquid pipe 40 of the loop heat pipe 1 are bent in a sideways U-shape, and the condenser 20 is arranged above the evaporator 10 with a predetermined gap formed between the condenser 20 and the evaporator 10. In addition, the evaporator 10 of the loop heat pipe 1 is fixed on the semiconductor chip 70, and the condenser 20 is arranged in a vicinity below the opening 6x in the top plate 6b on the inner part of the casing 6 of the electronic device.

In this third application example, the heat generated from the semiconductor chip 70 is transferred via the evaporator 10 and the vapor pipe 30, and moves to the condenser 20. The heat is thus dissipated from the condenser 20 to the outside through the opening 6x in the top plate 6b of the casing 6.

According to the embodiments described above, it is possible to provide a loop heat pipe, an electronic device including the loop heat pipe, and a method of manufacturing the loop heat pipe, which can avoid blocking or closing of the vapor pipe 30 and the liquid pipe 40 connecting the evaporator 10 and the condenser 20 of the loop heat pipe 1, even when the vapor pipe 30 and the liquid pipe 40 are bent. For this reason, the evaporator 10 and the condenser 20 of the loop heat pipe 1 can be arranged at different height positions within the electronic device, and a degree of freedom of design of the electronic device can be improved.

Further, in the loop heat pipe 1 in the embodiments described above, the grooves are formed in the vapor pipe 30 and the liquid pipe 40. However, the vapor pipe 30 and the liquid pipe 40 may of course have a planar shape in regions where the vapor pipe 30 and the liquid pipe 40 do not need to be bent.

Various aspects of the subject-matter described herein may be set out non-exhaustively in the following numbered clauses:

1. A method of manufacturing a loop heat pipe, comprising:
   stacking a plurality of metal layers to form an evaporator, a condenser, a vapor pipe connecting the evaporator and the condenser, and a liquid pipe connecting the evaporator and the condenser, and form a loop-shaped passage; and
   forming a plurality of first grooves in an outer surface of a first metal layer that is arranged at a first outermost surface of the loop heat pipe by the stacking.

2. The method of manufacturing the loop heat pipe according to clause 1, further comprising:
   bending the first metal layer in a region in which the plurality of first grooves are formed, so that the plurality of first grooves are positioned on an inner part and a bend line direction is approximately parallel to the plurality of first grooves.

3. The method of manufacturing the loop heat pipe according to clause 1, further comprising:
   forming a part of a pipe wall of a flow passage formed inside the loop heat pipe by the stacking using the first metal layer, so that an inner surface of the first metal layer contacts the flow passage; and
   forming a plurality of third grooves in a region of the inner surface of the first metal layer, corresponding to a region in which the plurality of first grooves are formed, by the stacking,
   wherein the plurality of third grooves are formed parallel to the plurality of first grooves at positions not overlapping positions of the plurality of first grooves.

4. The method of manufacturing the loop heat pipe according to clause 1, wherein the stacking forms a second metal layer arranged at a second outermost surface of the loop heat pipe opposite to the first outermost surface, so that a region of an outer surface of the second metal layer, corresponding to a region in which the plurality of first grooves are formed, includes a plurality of second grooves that are formed at positions overlapping positions of the plurality of first grooves.

5. The method of manufacturing the loop heat pipe according to clause 4, further comprising:
   forming a part of a pipe wall of a flow passage formed inside the loop heat pipe by the stacking using the second metal layer, so that an inner surface of the second metal layer contacts the flow passage; and
   forming a plurality of fourth grooves in a region of the inner surface of the second metal layer, corresponding to a region in which the plurality of second grooves are formed, by the stacking,
   wherein the plurality of fourth grooves are formed parallel to the plurality of second grooves at positions not overlapping positions of the plurality of second grooves.

6. The method of manufacturing the loop heat pipe according to clause 1, wherein the forming the plurality of first grooves forms the plurality of first grooves in the vapor pipe or the liquid pipe.

Although the embodiments are numbered with, for example, "first," "second," or "third," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A loop heat pipe comprising:
   a stacked structure formed by a plurality of metal layers that are stacked, including a first metal layer arranged at a first outermost surface of the loop heat pipe,
   wherein the stacked structure forms
      an evaporator configured to vaporize a working fluid and generate vapor;
      a condenser configured to liquefy the vapor of the working fluid;
      a vapor pipe configured to connect the evaporator and the condenser; and
      a liquid pipe configured to connect the evaporator and the condenser, to form a loop-shaped passage,
   wherein the first metal layer has an outer surface formed with a plurality of first grooves.

2. The loop heat pipe as claimed in claim 1, wherein
   the first metal layer forms a part of a pipe wall of a flow passage formed inside the loop heat pipe,
   the first metal layer has an inner surface in contact with the flow passage, and
   a region of the inner surface of the first metal layer, corresponding to a region in which the plurality of first grooves are formed, has a smooth surface.

3. The loop heat pipe as claimed in claim 1, wherein
   the first metal layer forms a part of a pipe wall of a flow passage formed inside the loop heat pipe,
   the first metal layer has an inner surface in contact with the flow passage, and
   a region of the inner surface of the first metal layer, corresponding to a region in which the plurality of first grooves are formed, includes a plurality of third grooves that are parallel to the plurality of first grooves and are formed at positions not overlapping positions of the plurality of first grooves.

4. The loop heat pipe as claimed in claim 1, wherein
the stacked structure includes a second metal layer arranged at a second outermost surface of the loop heat pipe opposite to the first outermost surface, and
a region of an outer surface of the second metal layer, corresponding to a region in which the plurality of first grooves are formed, includes a plurality of second grooves that are formed at positions overlapping positions of the plurality of first grooves.

5. The loop heat pipe as claimed in claim 4, wherein
the second metal layer forms a part of a pipe wall of a flow passage formed inside the loop heat pipe,
the second metal layer has an inner surface in contact with the flow passage, and
a region of the inner surface of the second metal layer, corresponding to a region in which the plurality of second grooves are formed, has a smooth surface.

6. The loop heat pipe as claimed in claim 4, wherein
the second metal layer forms a part of a pipe wall of a flow passage formed inside the loop heat pipe,
the second metal layer has an inner surface in contact with the flow passage, and
a region of the inner surface of the second metal layer, corresponding to a region in which the plurality of second grooves are formed, includes a plurality of fourth grooves that are parallel to the plurality of second grooves and are formed at positions not overlapping positions of the plurality of second grooves.

7. The loop heat pipe as claimed in claim 1, wherein the plurality of first grooves are formed in the vapor pipe or the liquid pipe.

8. The loop heat pipe as claimed in claim 1, wherein the first metal layer is bent in a region in which the plurality of first grooves are formed, so that the plurality of first grooves are positioned on an inner part and a bend line direction is approximately parallel to the plurality of first grooves.

9. The loop heat pipe as claimed in claim 1, wherein
the stacked structure includes
a second metal layer arranged at a second outermost surface of the loop heat pipe opposite to the first outermost surface; and
a plurality of intermediate metal layers that are stacked and interposed between the first and second metal layers;
wherein the plurality of intermediate metal layers respectively include openings that overlap and communicate with each other to form a flow passage of the working fluid in the vapor pipe, and
wherein the plurality of intermediate metal layers respectively include holes that communicate with each other and are arranged at overlapping positions deviated from each other in a plan view, to form micro-pore channels of a porous body in the liquid pipe.

10. An electronic device comprising:
a substrate;
a heat generating component provided on the substrate; and
a loop heat pipe according to claim 1 and provided on the substrate,
wherein the evaporator is arranged in a region on the heat generating component.

11. The electronic device as claimed in claim 10, wherein
the first metal layer forms a part of a pipe wall of a flow passage formed inside the loop heat pipe,
the first metal layer has an inner surface in contact with the flow passage, and
a region of the inner surface of the first metal layer, corresponding to a region in which the plurality of first grooves are formed, has a smooth surface.

12. The electronic device as claimed in claim 10, wherein
the first metal layer forms a part of a pipe wall of a flow passage formed inside the loop heat pipe,
the first metal layer has an inner surface in contact with the flow passage, and
a region of the inner surface of the first metal layer, corresponding to a region in which the plurality of first grooves are formed, includes a plurality of third grooves that are parallel to the plurality of first grooves and are formed at positions not overlapping positions of the plurality of first grooves.

13. The electronic device as claimed in claim 10, wherein
the stacked structure includes a second metal layer arranged at a second outermost surface of the loop heat pipe opposite to the first outermost surface, and
a region of an outer surface of the second metal layer, corresponding to a region in which the plurality of first grooves are formed, includes a plurality of second grooves that are formed at positions overlapping positions of the plurality of first grooves.

14. The electronic device as claimed in claim 13, wherein
the second metal layer forms a part of a pipe wall of a flow passage formed inside the loop heat pipe,
the second metal layer has an inner surface in contact with the flow passage, and
a region of the inner surface of the second metal layer, corresponding to a region in which the plurality of second grooves are formed, has a smooth surface.

15. The electronic device as claimed in claim 13, wherein
the second metal layer forms a part of a pipe wall of a flow passage formed inside the loop heat pipe,
the second metal layer has an inner surface in contact with the flow passage, and
a region of the inner surface of the second metal layer, corresponding to a region in which the plurality of second grooves are famed, includes a plurality of fourth grooves that are parallel to the plurality of second grooves and are formed at positions not overlapping positions of the plurality of second grooves.

16. The electronic device as claimed in claim 10, wherein the plurality of first grooves are formed in the vapor pipe or the liquid pipe.

17. The electronic device as claimed in claim 10, wherein the first metal layer is bent in a region in which the plurality of first grooves are formed, so that the plurality of first grooves are positioned on an inner part and a bend line direction is approximately parallel to the plurality of first grooves.

18. The electronic device as claimed in claim 10, wherein
the stacked structure includes
a second metal layer arranged at a second outermost surface of the loop heat pipe opposite to the first outermost surface; and
a plurality of intermediate metal layers that are stacked and interposed between the first and second metal layers;
wherein the plurality of intermediate metal layers include openings that overlap and communicate with each other to form a flow passage of the working fluid in the vapor pipe, and
wherein the plurality of intermediate metal layers include holes that communicate with each other and are arranged at overlapping positions deviated from each other in a plan view, to form micro-pore channels of a porous body in the liquid pipe.

* * * * *